United States Patent [19]

Mariani et al.

[11] 4,435,441
[45] Mar. 6, 1984

[54] METHOD OF FREQUENCY TRIMMING SURFACE ACOUSTIC WAVE DEVICES

[75] Inventors: Elio Mariani, Hamilton Square; Arthur Ballato, Long Branch, both of N.J.

[73] Assignee: The United States of America as represented by the Secretary of the Army, Washington, D.C.

[21] Appl. No.: 454,806

[22] Filed: Dec. 30, 1982

[51] Int. Cl.³ ............................................. B05D 3/06
[52] U.S. Cl. ........................................ 427/10; 427/44; 427/53.1; 427/54.1; 427/100
[58] Field of Search ............... 427/44, 54.1, 10, 53.1, 427/100; 29/25.35; 310/313 B

[56] References Cited

U.S. PATENT DOCUMENTS 4,015,319  4/1977  Levine ................................ 29/25.35
4,107,349  8/1978  Vig ....................................... 427/10

Primary Examiner—John H. Newsome
Attorney, Agent, or Firm—Robert P. Gibson; Jeremiah G. Murray; Anne Vachon Dougherty

[57] ABSTRACT

The adjustment of the resonant frequency of a surface acoustical wave (SAW) device is achieved utilizing the elastic deformation which occurs in a polymer when the polymer is energized. A film or patch of a polymer coating is applied to the substrate of the SAW device before sealing. The device is then subjected to an elevated temperature, to precure the polymer, and sealed. After being sealed with an appropriate transparent material, the device is subjected to a polymer-energizing media such as a light beam, high temperature or an electron beam. The applied polymer patch is energized resulting in elastic deformation of the patch. The polymer deformation results in a change in the elastic stiffness of the piezoelectric medium and thereby a change in the resonant frequency of the device.

9 Claims, 7 Drawing Figures

METHOD OF FREQUENCY TRIMMING SURFACE ACOUSTIC WAVE DEVICES

STATEMENT OF GOVERNMENT INTEREST

The invention described herein may be manufactured, used, and licensed by or for the Government for Governmental purposes without the payment to me of any royalties thereon.

BACKGROUND OF THE INVENTION

The invention relates generally to the field of analog signal processing and frequency control and more particularly to surface acoustic wave devices and the resonant frequencies thereof.

In the field of surface acoustic wave (SAW) devices, there is a need for precision frequency in high Q (mechanical response), narrowband SAW devices. Typically these devices operate at hundreds of megahertz (MHz) with bandwidths of only a few hundred kilohertz (kHz). Probable uses require low-loss, high stability frequency selection or frequency control elements which are required to operate directly at UHF/microwave frequencies including preselector filters and frequency control elements for oscillators or synthesizers for receiver front-ends. The devices, prior to any tuning, can be made to operate very close to the desired resonant frequency, however, precision frequency trimming is required to satisfy the very small required frequency tolerances.

Frequency trimming procedures for SAW devices that have been and are now being utilized are reviewed by Thompson in U.S. Pat. No. 3,864,161, issued Feb. 4, 1975, and by R. Fischer and L. Schulzke, in the paper, "Direct Plating to Frequency—A Powerful Fabrication Method for Crystals with Closely Controlled Parameters," at pages 209-213 of the *Proceedings of the 30th Annual Symposium on Frequency Control*—1976. Some of the methods discussed include plasma etching of the transducer structure, external tuning, dielectric mass-loading and application of metal overlay films. A major disadvantage to plasma etching is that the method results in weakening of the crystal structure increasing the possibility of stress fractures during the life of the device. External trimming has required laborious hand adjustment involving a high degree of inaccuracy and inordinate handling of the unsealed device. All of the techniques mentioned are performed before packaging and sealing the device. As such, with the resonance frequency set before packaging and sealing, there is no accounting for or adjusting of any stray capacitance associated with the packaging procedure. In addition, the above-cited methods require individual device tuning, not conducive to a production environment.

One variation of the dielectric mass-loading technique, the subject of U.S. Pat. No. 4,107,349 entitled "Method of Adjusting the Frequency of Piezoelectric Resonators", which was granted to Vig on Aug. 15, 1978, provides a method for adjusting the frequency, either before or after sealing, utilizing the deposition of a polymer on the resonator. The present invention makes use of an alternative polymer deposition technique and will therefore be distinguished herein. Vig, as stated above, uses deposition of polymers on the *surface* of the resonator to effect frequency trimming. The change in frequency results from the deposition of the mass itself unlike the present invention wherein is utilized the property of elastic deformation pursuant to curing the polyimide polymer. Vig's pre-sealing method involves placing the unsealed device in an evacuated enclosure which is subsequently filled with a polymerizable gas. The adjustment is effected by polymerizing the gas with radiation from an external source. The amount of polymer deposited or formed on the resonator causes the frequency change. A similar method is utilized (by Vig) after sealing; such that, a polymerizable gas is sealed under a fused quartz window within the resonator. At the time when frequency adjustment is required, the resonator is then subjected to radiation through the quartz window. The latter method requires excess polymerizable gas to be sealed within the element in amounts which could change the frequency of the resonator by large increments. Therefore, after the desired frequency has been attained, the remaining gas is polymerized by directing the radiation for deposition onto an area of the resonator away from the vibrating section. Vig's method, in both instances, absolutely requires that the deposition be *on* the resonator's active crystal element, and therefore, when applied to SAW devices, the deposition must be in the path of the surface acoustical waves. Since the waves travel on the surface of the element, the deposited polymer will have a damping effect on the waves and thereby degrade the response of the device, decrease the mechanical quality factor, Q, and increase the rate of aging of the element.

The aforementioned patent of Vig deals solely with frequency adjustment by mass-loading which effect invariably produces a frequency lowering. This is acknowledged explicitly of Column 1, lines 54 and 55 of said patent, as well as in claims 24 and 25 thereof. No provisions are made for upward adjustment of frequency in the Vig patent. However, it is well-known in the art that resonant devices of both bulk and surface acoustic wave varieties often age downward in frequency. It is highly desirable, therefore, to have a method of frequency adjustment that is capable of either positive or negative frequency adjustment. This may be done by the method of the instant invention.

It is therefore the object of this invention to provide a means for precisely trimming the resonance frequency of a surface acoustic wave device thereby changing the resonance frequency by a small fraction of the bandwidth.

It is another object to provide a means for fine-tuning the frequency of a surface acoustic wave device in order to adjust the operational resonance to within a few kilohertz (kHz) of that which is desired.

It is another object to provide a means for precisely adjusting the resonance frequency of a surface acoustic wave device in a manner capable of either increasing or decreasing the resonance frequency as required.

It is still another object to provide a technique permitting tuning to be completed after the device is sealed thereby compensating for any stray capacitances associated with the packaging procedures which are otherwise conducted after trimming.

Another object of the present invention is to provide a frequency trimming process amenable to a production environment, allowing alignment of frequency on several devices in one operation.

Finally, it is an object of the present invention to provide a means for trimming the frequency of a surface acoustic wave device without contributing to an increased rate of aging, degrading the response of the device, or decreasing the mechanical quality factor of the elements.

SUMMARY OF THE INVENTION

These and other objects are achieved through a new method of frequency trimming utilizing the strain effect or elastic deformation created by curing a polyimide polymer. The polymer is applied in a controlled fashion to a specific area of the device surface. The polymer is then partially cured, hermetically sealed and mounted on a specially-designed circuit board for final frequency trimming. The circuit board permits in-situ monitoring of the center frequency as it is altered. The frequency is altered due to the "pinching" or strain of the polymer coat due to activating the polymer by elevation of temperature, light beam stimulation, or electron beam activation. The extent of polymerization is controlled by controlling the temperature or the strength of the beam so that the process is stopped when the desired resonant frequency is achieved.

DETAILED DESCRIPTION OF THE PREFERRED EMBODIMENT

Figure 1:
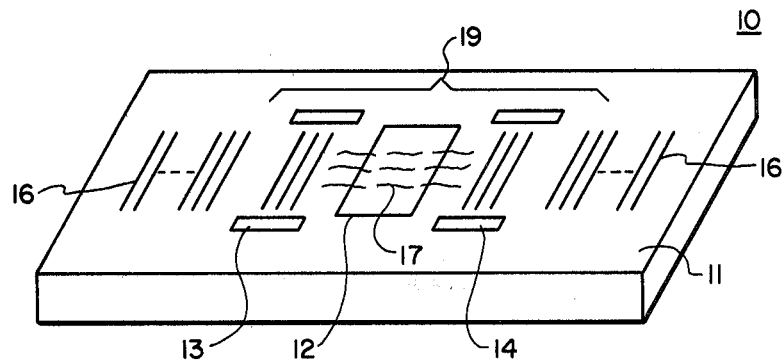
FIG. 1 is a perspective view of a preferred surface acoustic wave (SAW) resonator structure made in accordance with the present invention.

With reference to FIG. 1, a method of frequency trimming a surface acoustic wave (SAW) device, here illustrated as a SAW resonator, will be described. It is understood that the method is applicable to other types of SAW devices used as frequency control and signal processing elements, such as two-port delay lines for which the delay time for waves at a frequency could be trimmed by the subject procedure.

The SAW resonator, 10, prior to any tuning procedure, can be made to operate close to the desired frequency via application of well-known and well-defined design principles. Nevertheless, the typical fractional bandwidth of the devices is of the order of magnitude of 0.1% or less, which necessitates a precision frequency trim to satisfy the small frequency tolerance (i.e., a few kilohertz, kHz). The resonance frequency is a function of the elastic stiffness of the piezoelectric medium, usually quartz, found in the device. A small change in the elastic stiffness, therefore, will effect a small alteration in the surface wave velocity causing a corresponding change in the resonant frequency of the device. In order to effect this change, a specific area of the resonator surface is coated with a polymer. The polymer, such as polyimide, should be one exhibiting low-outgassing properties in order to maintain acceptable low aging rate properties. The application of the polymer may be done in any of a number of known controlled fashions in order to assure uniformity of thickness and precise placement in the prescribed area.

Figure 2:
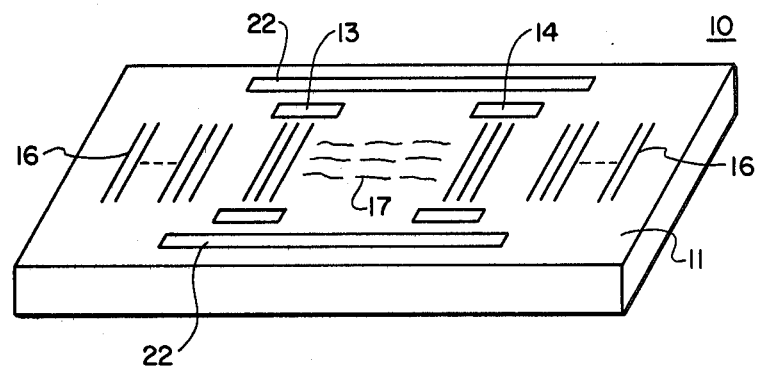
FIG. 2 is a perspective view of a SAW resonator structure made in accordance with the present invention.
Figure 3:
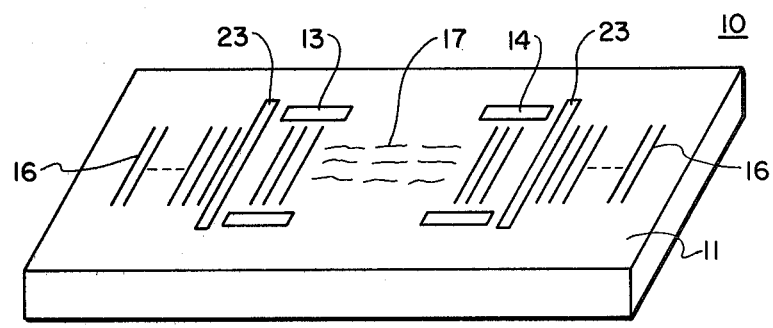
FIG. 3 is a perspective view of a SAW resonator structure made in accordance with the present invention.
Figure 4:
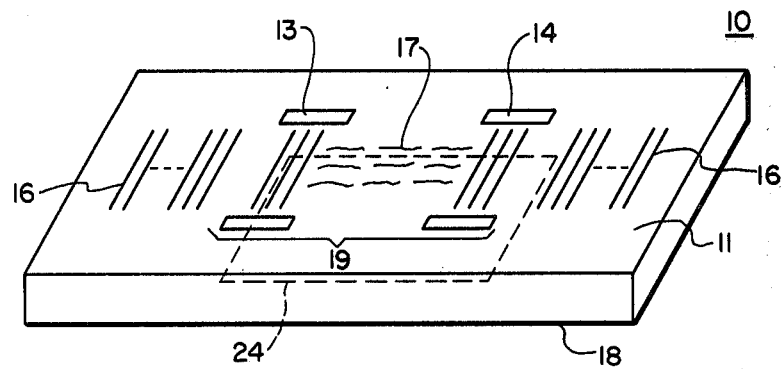
FIG. 4 is a perspective view of a SAW resonator structure made in accordance with the preferred embodiment of the subject invention.
Figure 5:
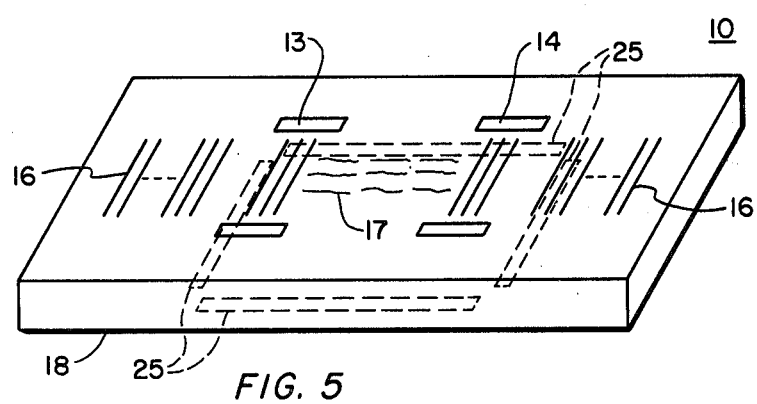
FIG. 5 is a perspective view of a SAW resonator structure made in accordance with the present invention.

In the first illustrated embodiment, FIG. 1, the polyimide coating 12 is applied to the region between the input and output tranducers, 13 and 14. That region defines a resonant cavity formed by the periodic reflectors, 16, on either end of the resonator substrate 11, in which is contained the active resonator element 19 comprised of the input and output transducers, 13 and 14, and the region therebetween referred to as the acoustic path 17 of the surface acoustic waves. The invention is also operable, and often preferred, should the presence of the polymer in the direct path 17 of the acoustic wave be undesirable as unacceptably degrading the device's response, for the polymer to be applied as in FIG. 2 at 22 along either or both sides of the device parallel to, but out of, the acoustic path 17. Still another and the most preferred embodiment, as in FIGS. 4 and 5, has the polymer, 24 and 25 respectively, applied to the underside 18 of the substrate 11. In FIG. 4 the underside polymer coating 24 is parallel to and of equal size with the active resonator element 19. The alternative embodiment of FIG. 5 illustrates the underside polymer coating 25 along the sides of and parallel to either the acoustic path 17 or the transducers 13 and 14.

Once the polyimide polymer coating 12 in FIG. 1. has been deposited on the substrate 11, the polyimide polymer 12 is partially cured by elevation of temperature to insure outgassing and then the SAW device 10 is hermetically sealed. The housing which encloses the device should be transparent to the medium which will be used to complete the curing of the polymer. The polymer coating 12 can be cured by elevation of temperature, or by stimulation using light beams or electron beams. Suitable housing materials, transparent to temperature and radiation, include fused quartz, sapphire, lithium fluoride, calcium fluoride, magnesium fluoride and high silica glass. Of these enclosure materials, the use of fused quartz or sapphire is preferred because of each one's high transmission of the radiation, widespread availability and relative inertness. Once the device has been pre-cured and sealed, it is mounted on a circuit board which will monitor, in-situ, the center frequency of the device and thereby indicate to what extent frequency adjustment is needed.

The frequency of a SAW device depends upon the acoustic wave velocity, which is proportional to the square root of an effective elastic constant $\bar{c}$. In the absense of finite strain effects (i.e. pre-curing), the effective elastic constant $\bar{c}$ will depend upon the linear elastic constants of the medium, for example quartz, the crystal substrate orientation with respect to the crystallographic axes of the medium, the type of surface wave and the direction of propagation of the SAW. With finite strains present, due to the polyimide coating patches, the third-order (nonlinear) elastic constants come into play and modify $\bar{C}$, leading to a different acoustic velocity, and hence a different resonant frequency. The relative change in frequency from that which obtains in the purely linear case will be denoted $\Delta f/f$. Assuming that the average finite strain appearing in the acoustic path due to the action of the polyimide patch is $S_o$, and that the effective third-order elastic constant for the cut, mode type, and propagation direction is $c_3$, the frequency may be written as $$f = [\sqrt{(c+c_3 S_0)/\rho}]/l.$$

Rho ($\rho$) is the mass-density of the material and $l$ is a characteristic length associated with the device.

The frequency shift is just $$\Delta f/f \approx (c_3 S_0)/2\bar{c}$$

Figure 6:
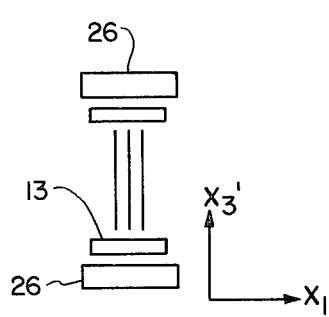
FIG. 6 illustrates a top view of portion of a SAW resonator device showing disposition of polyimide polymer frequency adjustment patches in accordance with the present invention to an arrangement characteristic of rotated-Y-cut SAW plates of quartz including the ST-cut.
Figure 7:
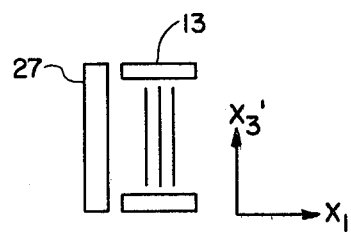
FIG. 7 illustrates a top view of portion of a SAW resonator device showing deposition of polyimide polymer films in accordance with the present invention to an alternate arrangement characteristic of rotated Y-cut SAW plates of quartz including the ST-cut.

If either the strain $S_o$ or the third-order elastic contant is zero, the frequency shift is zero. The important aspect is that the sign of $\Delta f/f$ depends upon the sign of $(c_3 S_o)$. A given polyimide polymer will induce in the vicinity of its application a finite strain $S_o$ of a given sign, so that the shift in frequency will depend upon the sign of $c_3$ for a given polymer. The frequency shift, $\Delta f/f$, may be effected in either direction, increased or decreased as necessary, by selecting the polyimide patch placement to give the appropriate strain. in FIG. 6, the patches are along $x_3'$ while SAW propagation takes place along the $x_1$, axis as is characteristic of rotated Y-cut SAW plates of quartz, including the ST-cut. The appropriate third-order elastic constant $c_3$ for this arrangement approximates $+318$. In FIG. 7, the patch is along $x_1$, the direction of propagation, and the appropriate $c_3$ is $-1383$. (Values of $c_3$ are in $10^9$ pascals from "Third-Order Elastic Coefficients of Quartz," by R. N. Thurston, H. J. McSkimin and P. Andreatch, Jr. appearing in 37 *Journal of Applied Physics*, pages 267-275 (1966).) Thus, by selecting a patching arrangement, the sign of $\Delta f/f$ may be determined. The strain pattern generated by each patch will extend into the area surrounding the patch, so that even though the patches do not reach to the area where the SAW's are propagating, the strain fields do.

The strain is achieved when the polymer coating is polymerized, or cured, by elevation of the temperature, stimulation by light beam (eg., ultraviolet), or activation by electron beam, depending upon the needs of the system and the polymer used, should it be a thermally activated polymer, etc.. When the polymer is energized, polymerization takes place causing the polymer to "pinch" or strain the substrate to which it is applied. An example of strain induced in a crystal resonator substrate can be found in "Frequency Control" by Ballato and Searles, 16 *Physics Today* 52 (December 1963). The desired effect of strain changes the elastic stiffness of the piezoelectric medium and thereby effects a shift in the resonant frequency of the device, as noted above. The amount of frequency shift depends upon $S_o$, and this in turn depends upon the amount of curing of the polymide polymer.

If the polyimide is partially cured (polymerized) before sealing, any small outgassing will be carried away, and the polyimide will remain inert at the operating temperatures of the device. The device, as above, is then sealed and the amount of frequency adjustment necessary, and also the sign of the shift, determined. If it is known in advance for a particular class of devices that the shift needed will be in a certain direction, with the amount of shift needed undetermined until after sealing, then the polyimide patches can be placed either as in FIG. 6 or in FIG. 7, which illustrate ST cut quartz resonators and are directed to when using elevation of temperature as the polymerizing means. The device is then subjected to an elevated temperature to more completely polymerize the polyimide and bring the device to the proper frequency. It must be known in advance how the frequency at the elevated temperature corresponds to the frequency at the lower reference (and anticipated use) temperature. Such a relation and calibration technique is well-known in the art. The even more versatile and more effective arrangement entails the use of a light (such as a laser) or electron beam to be shined through a transparent window of the enclosure. Using this method, one can use the arrangements in FIGS. 6 and 7 concurrently as follows: Apply both patch arrangements to the device; partially cure at elevated temperature; seal device; determine sign and magnitude of frequency adjustment required; and, apply beam onto the path pattern that realizes the frequency adjustment of proper sign.

When the polyimide patch is applied outside of the acoustic path, 17, as in FIGS. 2-7, the elastic effect is reduced somewhat in the active regions of the device but not severely so. The optimum straining effect is realized in the instances when the polymer coating is applied to the resonator, FIG. 1, or on the underside of the substrate corresponding to the size of the active resonator element 19, as in FIG. 4. Since the coating on the surface may interfere with the device response, the latter case achieves the optimum straining and frequency-trimming effect with the minimum of interference with the aging and functioning of the device.

The above-described process could be automated to achieve some prescribed temperature vs. time curing profile in order to yield the nearly exact resonance frequency for the device or batch of devices.

The chemical process of polymerization (or curing) can, as stated above, be brought about by any one of a number of stimuli. Under the normal use of the SAW resonator after trimming, the polymer-coated piezoelectric element will not be exposed to further radiation. However, at the lower operating temperature of the device, thermally activated polymerization may still take place. This continued polymerization will not effect the resonance frequency of the device nor will it contribute to the aging rate or effect the long-term stability of the device. The chemical reactions germane to polymerization take place at rates that are exponential functions of temperature. The reaction rates are proportional to the function EXP ($-E/kT$). In this relation, E is the so-called "activation" energy that must be supplied to permit the reaction to proceed and which is a material property of the polymer, k is Boltzmann's constant ($1.38 \times 10^{-23}$ J/K), and T is the absolute temperature. Due to the nature of the exponential function, small changes in temperature can produce enormous changes in reaction rates. Temperatures in the operating range, however, will have completely negligible effects on the polyimide polymers; so that the resonant frequency to which the SAW device is tuned will not be changed.

Should the device age over time, however, one can continue to make frequency adjustments, if required. For example, the initial $\Delta f/f$ adjustment might be of one sign and, years later, the device may have aged in a direction and to such an extent that an adjustment of the opposite sign is called for. The imperfectly cured polymers having FIG. 6 and 7 patches age inappreciably at operating temperatures, but are capable of being more perfectly cured readily by light or electron beam radiation at any subsequent time.

It is understood that this invention is not limited to the exact details of construction shown and described above. Obvious modifications will occur to a person skilled in the art, and would fall within the spirit and scope of this invention.

What is claimed is:

1. A method of adjusting the frequency of a piezoelectric device, having a substrate containing an active resonator element with an acoustic path, comprising the steps of:
    applying a low out-gassing polymer to the substrate of the device;
    partially curing the device;
    sealing the device; and
    energizing the polymer.

2. A method as defined in claim 1 wherein the polymer is energized by elevating the temperature.

3. A method as defined in claim 1 wherein the polymer is energized by irradiating said polymer with a light beam.

4. A method as defined in claim 1 wherein the polymer is energized by irradiating said polymer with an electron beam.

5. A method as defined in claim 1 wherein the polymer is applied to the substrate parallel to but out of the acoustic path of the device.

6. A method as defined by claim 1 wherein the polymer is applied to the substrate on the underside of said substrate.

7. A method as defined by claim 6 wherein the applied polymer has a size corresponding to the size of the active resonator element.

8. A method as defined by claim 6 wherein the polymer is applied to the underside of the substrate parallel to but out of the acoustic path of the device.

9. A method of adjusting the frequency of a surface acoustical wave device, having a substrate containing an active resonator element with an acoustic path, comprising the steps of:
    applying a low outgassing polymer to the substrate of the device;
    partially curing the polymer by elevating the temperature of the device;
    sealing the device by hermetically applying a material transparent to a polymer-energizing medium;
    mounting the device on a circuit board means for measuring and monitoring the frequency of said device;
    determining the desired frequency of the device;
    energizing the polymer; and
    monitoring the frequency as it approaches the desired frequency due to the energization of the polymer.

* * * * *